(12) United States Patent
Okada et al.

(10) Patent No.: US 6,383,910 B2
(45) Date of Patent: May 7, 2002

(54) METHOD OF MANUFACTURING A SEMICONDUCTOR DEVICE, AND A SEMICONDUCTOR DEVICE MANUFACTURED THEREBY

(75) Inventors: Masakazu Okada; Keiichi Higashitani; Hiroyuki Chibahara, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/800,579

(22) Filed: Mar. 8, 2001

(30) Foreign Application Priority Data

Jul. 28, 2000 (JP) .......................................... 2000-229206

(51) Int. Cl.$^7$ .......................................... H01L 21/4763
(52) U.S. Cl. .......................................... 438/622; 438/618
(58) Field of Search .......................................... 438/622, 669, 438/672, 685, 745, 748, 754, 401, 430, 462, 592, 618, 642, 970, 975

(56) References Cited

U.S. PATENT DOCUMENTS 5,173,438 A * 12/1992 Sandhu .......................... 438/450
6,096,632 A * 8/2000 Drynan .......................... 438/618
6,175,131 B1 * 1/2001 Adan .......................... 257/306
6,232,228 B1 * 5/2001 Kwag et al. .................. 438/669

FOREIGN PATENT DOCUMENTS

| JP | 2-90511 | 3/1990 |
| JP | 9-223656 | 8/1997 |

* cited by examiner

Primary Examiner—David Nelms
Assistant Examiner—Phuc T. Dang
(74) Attorney, Agent, or Firm—McDermott, Will & Emery

(57) ABSTRACT

There is described a method of manufacturing a semiconductor device which ensures formation of a step in an alignment mark, to thereby improve the accuracy of alignment. A tungsten layer is formed on an interlayer dielectric film including an opening for use in forming an alignment mark. The tungsten layer is abraded by means of the CMP technique. At this time, the initial thickness of the interlayer dielectric film is made greater than the total sum of the minimum step identifiable for alignment and the amount of abrasion, thus ensuring formation of an alignment step. Further, a gate electrode is removed from the position where a contact alignment mark is formed. Alternatively, an aluminum electrode is removed from a position immediately below a through hole alignment mark.

8 Claims, 13 Drawing Sheets

METHOD OF MANUFACTURING A SEMICONDUCTOR DEVICE, AND A SEMICONDUCTOR DEVICE MANUFACTURED THEREBY

BACKGROUND OF THE INVENTION

1. Field of the Invention

The present invention relates to a method of manufacturing a semiconductor device utilizing alignment marks, as well as to a semiconductor device manufactured by the method. More particularly, the present invention relates to specifications concerning the dimensions of an alignment mark for use in chemical-mechanical polishing of a tungsten layer (hereinafter abbreviated as the "W-CMP technique"), as well as to an improved process for improving the accuracy of alignment.

2. Background Art

Some conventional methods for manufacturing a semiconductor device utilizing alignment marks will be described.

First, conventional example 1 will be described.

FIGS. 8A to 8C are cross-sectional views showing an example method of forming an alignment mark during the course of the conventional method of manufacturing a semiconductor device.

As shown in FIG. 8A, according to a conventional method of manufacturing a semiconductor device, an interlayer oxide film 2 is deposited on a semiconductor substrate (wafer) 1 (or an aluminum interconnection 1 placed on a semiconductor substrate). The interlayer oxide film 2 is selectively etched by means of photolithography, thereby forming a normal contact 9 and an alignment mark 8. Further, a barrier metal 3 is formed over the interlayer oxide film 2, as well as on the normal contact 9 and the alignment mark 8, by means of sputtering. Tungsten 4 is deposited on the barrier metal layer 3 by means of the CVD technique.

As shown in FIG. 8B, the portion of the tungsten layer 4 and the portion of the barrier metal 3 that are placed on the interlayer oxide film 2, and a portion of the upper surface of the interlayer oxide film 2 are abraded by means of the W-CMP technique.

As shown in FIG. 8C, an additionally-stacked barrier metal layer 5 is formed over the entire surface of the wafer 1 by means of sputtering. An AlCu layer 6 and an antireflection-coating (ARC) film 7 are formed on the additionally-stacked barrier metal layer 5 by means of the sputtering technique. Subsequently, resist 10 is applied over the wafer 1 and is exposed.

The wafer is aligned during exposure through use of a laser beam or visible light. Thick metal layers (i.e., the ARC film 7, the AlCu layer 6, and the additionally-stacked barrier metal layer 5) lie immediately below the resist film 10. If no step is formed in the alignment mark 8, the surface of the wafer 1 becomes a completely mirrored surface, thus rendering an alignment operation impracticable.

Conventional example 2 will now be described.

FIGS. 9A to 9E are cross-sectional views showing an example method of forming an alignment mark carried out during the course of the conventional method of manufacturing a semiconductor device.

As shown in FIG. 9A, according to a method of manufacturing a conventional semiconductor device, an STI layer (a buried isolation layer or a trench isolation layer) 11, a gate oxide film 24, a gate electrode 12, a sidewall 13, and a CoSi layer 14 are formed on the semiconductor substrate 1 (Si substrate).

As shown in FIG. 9B, an oxide film is deposited on the substrate 1, and the oxide film is smoothed by means of the CMP technique (i.e., the oxide film CMP method), thereby forming an interlayer oxide film 15.

The corresponding wafer is subjected to photolithography, and contact holes 18 and a contact alignment mark 19 are formed by means of anisotropic dry etching.

As shown in FIG. 9C, a barrier metal layer 16 is formed by means of sputtering, and tungsten 17 is deposited over the surface of the wafer by means of the CVD technique.

As shown in FIG. 9D, portions of the tungsten layer 17 and top horizontal portions of a barrier metal layer 16 are abraded by means of the W-CMP technique, thus producing a tungsten plug 20. At this time, a step P appears in the contact alignment mark 19.

As shown in FIG. 9E, an additionally-stacked barrier metal layer 21, an AlCu layer 22, and an ARC film 23 are formed by means of the sputtering technique. At this time, the step P still remains in the contact alignment mark 19 in its present form.

In conventional example 2, the alignment mark 19 has a small step.

Conventional example 3 will now be described.

FIGS. 10A through 12C are cross-sectional views showing an example method of forming an alignment mark carried out during the course of the conventional method of manufacturing a semiconductor device.

FIGS. 10A through 10C are identical with FIGS. 8A through 8C showing example 1.

As shown in FIG. 11A, the ARC film 7, the AlCu layer 6, and the additionally-stacked barrier metal layer 5 are selectively etched by means of dry etching. At this time, as explained later with reference to FIG. 12A, an aluminum (Al) cap 28 serving as a cap of an alignment mark, an Al interconnection 30, and an underlying aluminum (Al) layer 29 which lies below a through hole alignment mark are formed.

As shown in FIG. 11B, an oxide film is deposited on the corresponding wafer, and the thus-deposited oxide film is smoothed by means of the CMP technique, thereby forming an interlayer oxide film 25.

The wafer is subjected to photolithography and dry etching. At this time, a through hole alignment mark 26 and a through hole 27 are formed.

As shown in FIG. 11C, a barrier metal layer 31 is formed by means of sputtering, and tungsten 32 is deposited by means of the CVD technique.

As shown in FIG. 12A, portions of the tungsten layer 32, those of the barrier metal layer 31, and those of the interlayer oxide film 25 are abraded by means of the W-CMP technique.

As shown in FIG. 12B, an additionally-stacked barrier metal layer 33, an AlCu layer 34, and an ARC layer 35 are formed by means of sputtering, and a resist film 36 is formed.

As shown in FIG. 12C, the ARC layer 35, the AlCu layer 34, and the additionally-stacked barrier metal layer 33 are selectively etched, thereby forming an Al electrode 37 and an alignment mark/cap aluminum (CAP-AL) layer 38.

In example 3, the depth of a step formed in the alignment mark 26 is determined by the process shown in FIG. 12A, and only a small step is formed. Further, the step is shallower than the thickness of the intermediate oxide film 25.

The present invention has been conceived to solve a drawback of the background art; that is, difficulty in forming a sufficient step in an alignment mark.

A problem which the present invention is to solve will be described by reference to FIGS. 13A to 13C.

As illustrated in FIGS. 13A to 13C, 'A' denotes an initial step formed in a tungsten layer 4; 'B' designates the thickness of an interlayer dielectric film 2; 'C' designates the width of an alignment mark; 'D' designates the width of the top of the alignment mark after tungsten has been deposited on a wafer; 'E' denotes the diameter of a through hole; 'F' denotes the thickness of the tungsten film; 'K' denotes the amount of tungsten film to be abraded by means of the W-CMP technique; 'G' denotes the thickness of an interlayer film after tungsten has been abraded by means of the W-CMP technique; 'H' denotes a step of the alignment section after the tungsten film has been abraded by means of the W-CMP technique; and 'I' denotes a step of the alignment section after an AlCu layer 6 and a barrier metal film 7 have been deposited on the wafer.

In a case where the step 'I' of the alignment section does not have a given size, a laser beam or visible light, which is reflected during alignment operation, has a weak intensity, thus posing difficulty in detection of the edge of an alignment mark. As a result, alignment becomes impossible or accuracy of alignment is decreased greatly.

The present invention provides a method of maintaining the step.

SUMMARY OF THE INVENTION

According to one aspect of the present invention, in a method of manufacturing a semiconductor device, an interlayer dielectric film is formed on a semiconductor substrate. An opening for alignment purpose is formed in the interlayer dielectric film. A tungsten layer is formed on the interlayer dielectric film such that a depression is formed in the opening. The tungsten layer is abraded to thereby form an alignment step in the opening. Here, the interlayer dielectric film is formed such that an initial thickness of the interlayer dielectric film is greater than the total sum of the minimum step identifiable for alignment and the amount of abrasion.

According to another aspect of the present invention, in a method of manufacturing a semiconductor device, an interlayer dielectric film is formed on a semiconductor substrate. An opening for alignment purpose is formed in the interlayer dielectric film. A tungsten layer is formed on the interlayer dielectric film such that a depression is formed in the opening. The tungsten layer is etched so that thickness is reduced by a predetermined amount. The tungsten layer is abraded to thereby form an alignment step in the opening.

Other features and advantages of the invention will be apparent from the following description taken in connection with the accompanying drawings.

DETAILED DESCRIPTION OF THE PREFERRED EMBODIMENTS

Figure 1A:
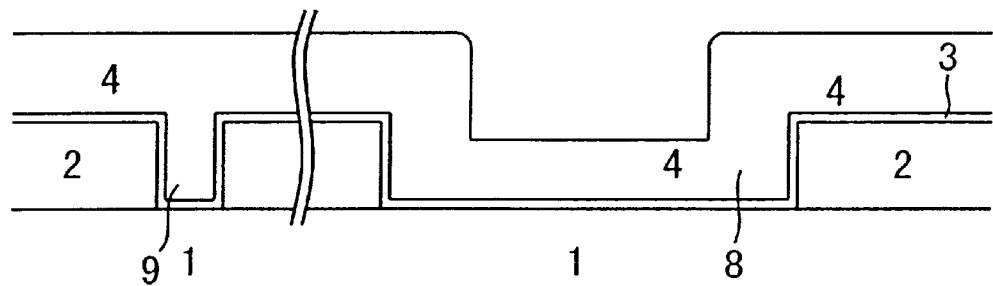
FIGS. 1A through 1C are cross-sectional views showing a method of forming an alignment mark in a method of manufacturing a semiconductor device according to a first embodiment of the present invention.

Preferred embodiments of the present invention will be described hereinbelow by reference to the accompanying drawings. Throughout the drawings, like or corresponding elements are assigned like reference numerals, and repetition of their explanations is omitted or simplified.

First Embodiment

Figure 1B:
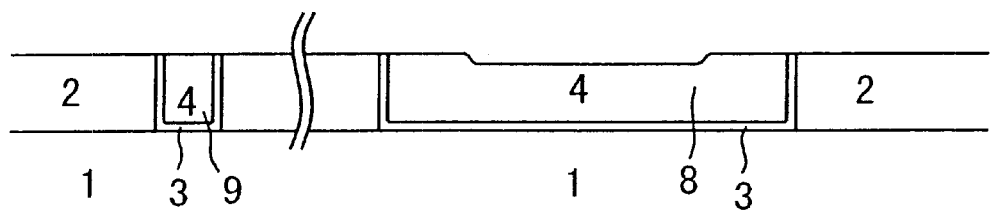
Figure 1C:
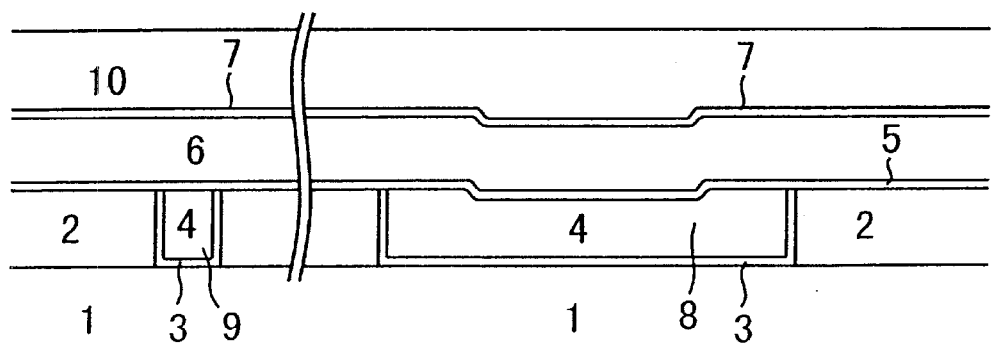

FIGS. 1A through 1C are cross-sectional views showing a method of manufacturing a semiconductor device according to a first embodiment of the present invention; more particularly, to a method of forming an alignment mark.

The method will now be described. As shown in FIG. 1A, an interlayer dielectric film 2 is deposited to a thickness of 'B' μm on a semiconductor substrate (wafer) 1 (or an Al interconnection 1). Subsequently, the wafer is subjected to photolithography, to thereby selectively etch the interlayer dielectric film 2. As a result, a normal contact 9 and an alignment mark 8 are formed. Provided that the diameter of a through hole to be used for forming the normal contact 9 assumes 'E' nm, the alignment mark 8 assumes a width 'C' as defined by the following equation.

$$C > 1.5E \qquad (1)$$

In order to prevent filling of a step of the alignment mark 8, which would otherwise be caused during deposition of tungsten (W), the width 'C' of the alignment mark 8 is set to assume a value which is 1.5 times the diameter 'E' of the through hole.

Here, Eq. (1) is usually derived from $F > 1.5 \times E/2$ and a necessity for satisfying $C > 2F$.

Figure 2A:
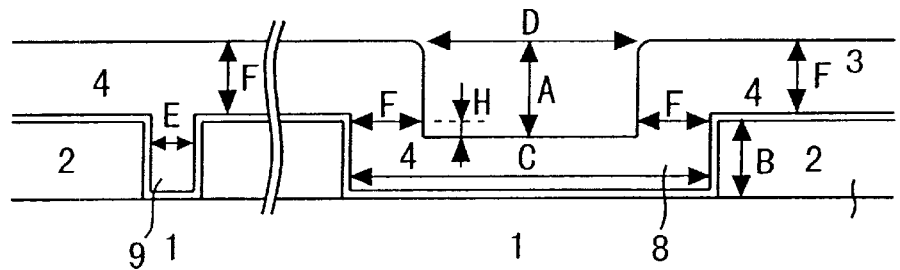
FIGS. 2A through 2D are cross-sectional views showing a method of forming an alignment mark in a method of manufacturing a semiconductor device according to a second embodiment of the present invention.
Figure 2B:
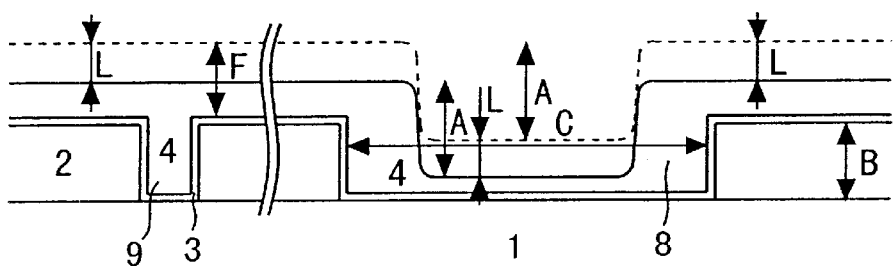
Figure 2C:
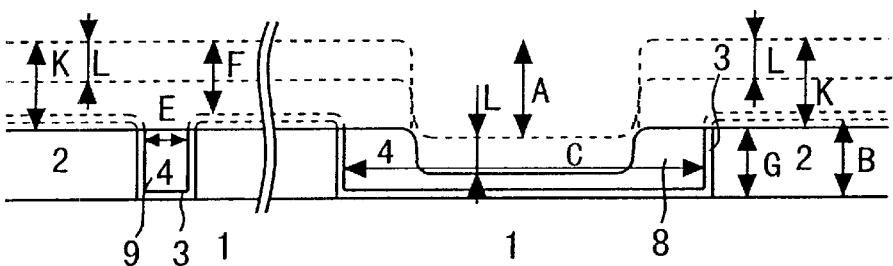

Meanwhile, reference character 'B', 'C', 'E' or others may be referred to FIG. 2A thorough FIG. 2C.

Barrier metal 3 is sputtered, and tungsten 4 is deposited to a thickness of 'F' nm by means of the CVD technique. An initial step 'A' of the alignment mark is identical with the depth 'B' of the interlayer dielectric film 2.

By means of forming an alignment mark through use of Eq. (1), there can be defined the dimension 'D' of the top of the alignment mark 8 after deposition of tungsten.

As shown in FIG. 1B, portions of the tungsten layer 4 and those of the barrier metal layer 3 that are laid on the interlayer dielectric film 2, and portions of the upper surface of the interlayer dielectric film 2 are abraded by 'K' nm by means of the W-CMP technique.

Here, A=B=H+K. Namely, the thickness 'B' of the interlayer dielectric film 2 constitutes, in unmodified form, the initial step 'A'. The thickness 'B' is equal to the sum total of a step 'H' of an alignment section formed after the W-CMP operation and the amount 'K' removed in the W-CMP operation.

As shown in FIG. 1C, an additionally-stacked barrier metal layer 5 is formed over the entire surface of the wafer by means of sputtering, and an AlCu layer 6 and an ARC layer 7 are formed on the barrier metal layer 5 by means of sputtering. Subsequently, resist 10 is applied over the surface of the wafer, and the wafer is exposed.

In connection with a step 'H' formed in the alignment section after W-CMP operation, the thickness 'B' of the interlayer dielectric film 2 is set as follows, provided that the minimum step enabling alignment is taken as 'Z'.

B=H+K, and a minimum value of 'H' is taken as 'Z', thereby deriving $$B > Z + K \tag{2}$$

More specifically, the thickness 'B' of the interlayer dielectric film 2 is set to become greater than the sum of the minimum step 'Z' enabling alignment and the amount 'K' of abrasion performed in the W-CMP operation.

As has been described above, in the present embodiment, the width 'C' of the alignment mark 8 and the thickness 'B' of the interlayer dielectric film 2 are determined so as to satisfy Eqs. (1) and (2). Thus, the step 'Z' required by the alignment mark 8 can be ensured.

The method of manufacturing a semiconductor device according to the first embodiment can be summarized as follows:

In the present embodiment, the interlayer dielectric film 2 is formed on the semiconductor substrate 1, and an opening for alignment purpose is formed in the interlayer dielectric film 2. The tungsten layer 4 is formed on the interlayer dielectric film 2 so that a depression is formed in the opening. The tungsten layer 4 is abraded, to thereby leave an alignment step in the opening. A metal barrier layer, a conductive layer, and another metal barrier layer are formed on the wafer. At this time, the initial thickness of the interlayer dielectric film 2 is set to become greater than the sum of the minimum step distinguishable for alignment and the amount of abrasion.

Second Embodiment

FIGS. 2A through 2D are cross-sectional views showing a method of manufacturing a semiconductor device according to a second embodiment of the present invention; more particularly, to a method of forming an alignment mark.

The method will now be described. The operation shown in FIG. 2A is identical with that shown in FIG. 1A according to the first embodiment.

As shown in FIG. 2B, the tungsten film 4 is etched by a depth of 'L' nm by means of anisotropic etching such that the depth 'L' does not equal thickness 'F' to which tungsten is to be deposited (F>L).

As shown in FIG. 2C, the tungsten film and the barrier layer metal layer 3 that have remained after the W-CMP operation, and a portion of the upper surface of the interlayer dielectric film 2 are abraded.

In a case where these films are abraded to a depth corresponding to the amount 'K' of abrasion performed when the tungsten film 4 is not etched beforehand, the amount of abrasion is defined as 'K–L'.

In the first embodiment, $$B > Z + K \tag{2},$$

and hence in the second embodiment $$B > Z + K - L \tag{3}.$$

In contrast with the case of the first embodiment, the total amount of abrasion becomes 'K–L' in the second embodiment. Consequently, in the second embodiment the thickness 'B' of the interlayer dielectric film 2 can be made thinner, by 'L' nm, than in the first embodiment.

If tungsten is etched back by means of anisotropic etching while the initial step of the alignment mark 8 is retained, the initial thickness of the interlayer dielectric film 2 can be made thinner by the amount corresponding to the amount to which tungsten has been etched back.

In more detail, there is a case where the thickness of the interlayer dielectric film 2 fails to sustain the thickness 'B', such as that described in connection with the first embodiment, in view of the function of a device. In such a case, the method according to the second embodiment enables ensuring of a step in the alignment mark 8 even in the case of use of a thinner interlayer dielectric film.

Figure 2D:
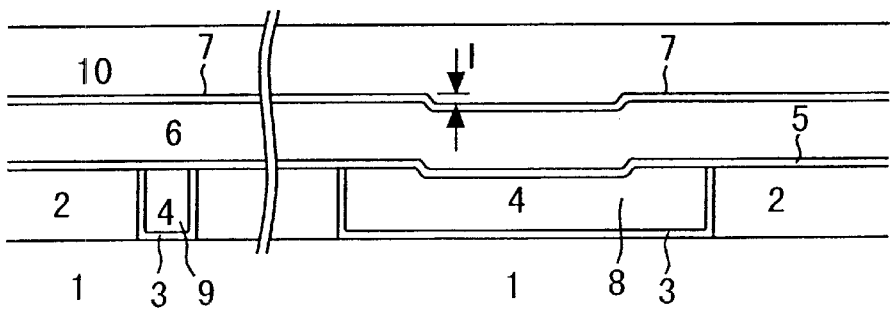

As shown in FIG. 2D, the additionally-stacked barrier metal layer 5 is formed on the entire surface of the wafer by means of sputtering, and the AlCu layer 6 and the ARC layer 7 are formed by means of sputtering. Subsequently, the resist 10 is applied over the wafer and exposed.

The method of manufacturing a semiconductor device according to the second embodiment can be summarized as follows:

In the present embodiment, the interlayer dielectric film 2 is formed on the semiconductor substrate 1. An opening for alignment purpose is formed in the interlayer dielectric film 2. The tungsten layer 4 is formed on the interlayer dielectric film 2 such that a depression is formed in the opening. The tungsten layer 4 is etched away by a predetermined thickness, and the tungsten layer 4 is abraded, thereby leaving the alignment step in the opening.

Third Embodiment

In the first and second embodiments, in a case where the width 'C' of the alignment mark 8 is set to a considerably large value, erosion will arise, which in turn reduces the step of the alignment section formed after W-CMP operation. The present embodiment provides a method of reducing the width 'C' of the alignment mark 8.

In the third embodiment, the width 'C' can be reduced to C>2×(F–L) by means of employing isotropic etching in lieu of anisotropic etching performed before a W-CMP operation.

The only requirement is that the width 'C' of the alignment mark 8 be greater than twice the thickness of a tungsten film which remains after the deposited tungsten film of thickness 'F' has been etched back by the amount 'L'.

Fourth Embodiment

In a fourth embodiment, hydrated ammonium is used as an etchant during the isotropic etching operation performed in the third embodiment. As a result, etching of tungsten and removal of minute foreign particles can be effected.

Fifth Embodiment

Figure 3:
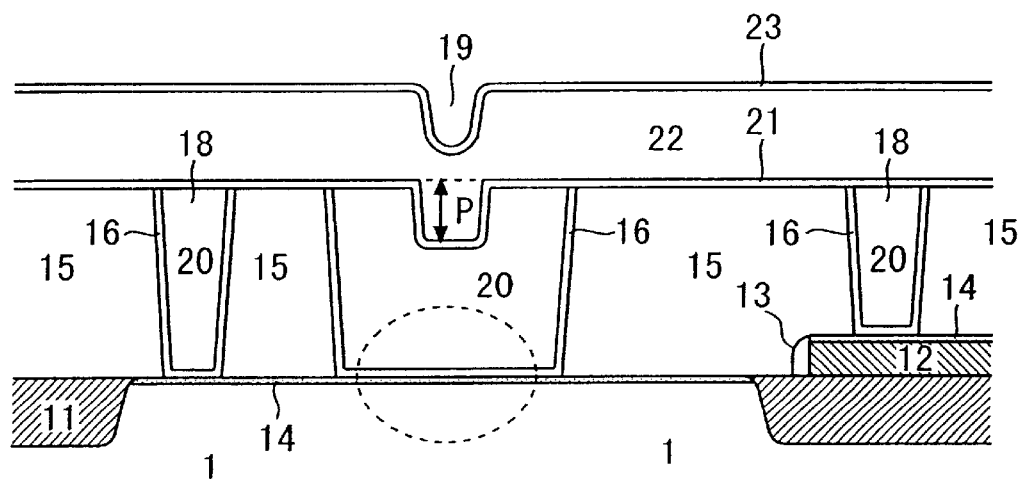
FIG. 3 is a cross-sectional view showing a method of forming a contact alignment mark in a method of manufacturing a semiconductor device according to a fifth embodiment of the present invention.

FIG. 3 is a cross-sectional view showing a method of manufacturing a semiconductor device according to a fifth embodiment of the present invention; more particularly, to a method of forming a contact alignment mark.

The present embodiment is directed to increase the alignment step 'P' formed in conventional example 2.

In order to make the contact alignment mark formed in conventional example 2 deeper, a gate electrode located immediately below the contact alignment mark is removed, thereby taking, as an active region, an area from which the gate electrode has been removed.

The method of manufacturing a semiconductor device will be described hereinbelow.

Figure 9A:
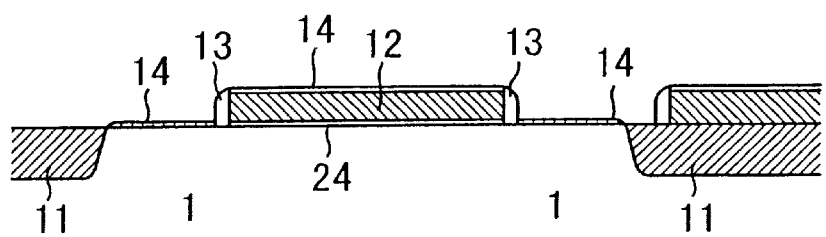
FIGS. 9A to 9E are cross-sectional views showing another example method of forming an alignment mark carried out during the course of the conventional method of manufacturing a semiconductor device.

As shown in FIG. 9A, under the conventional method of manufacturing a semiconductor device, an STI (isolation dielectric film) 11, a gate oxide film 24, a gate electrode 12, a sidewall 13, and a CoSi layer 14 are formed on a semiconductor substrate 1 (Si).

In contrast, under the method of manufacturing a semiconductor device according to the present embodiment, the gate electrode 12 is not formed in a position at which a contact alignment mark is to be formed. Alternatively, the gate electrode 12 is removed from a position at which a contact alignment mark is to be formed. As a result, only the CoSi layer 14 is formed on the surface of the substrate 1 shown in FIG. 9A.

Subsequent processes are the same as those employed in the conventional example.

Figure 9B:
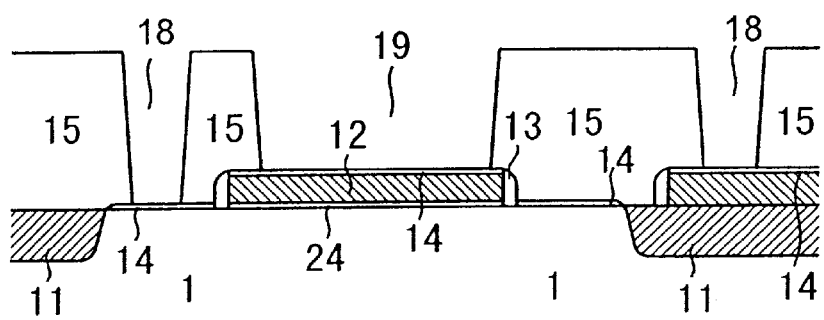

An oxide film is deposited by reference to FIG. 9B, and the thus-deposited oxide film is smoothed by means of CMP, thereby forming an interlayer oxide film 15.

The wafer is then subjected to photolithography and anisotropic dry etching, thus forming a contact hole 18 and a contact alignment mark 19.

Figure 9C:
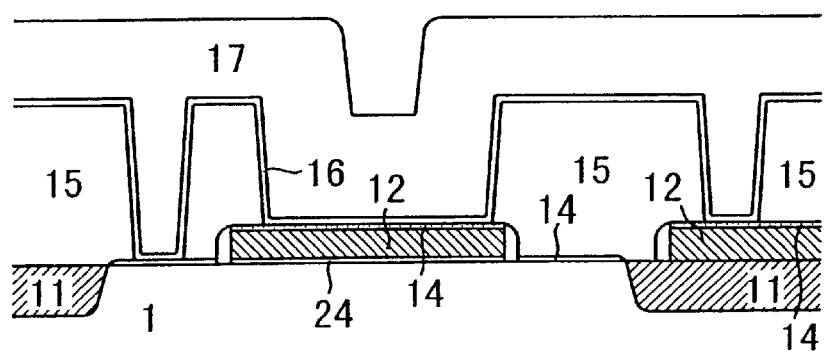

By reference to FIG. 9C, a barrier metal layer 16 is formed by means of sputtering, and tungsten 17 is deposited by means of the CVD technique.

Figure 9D:
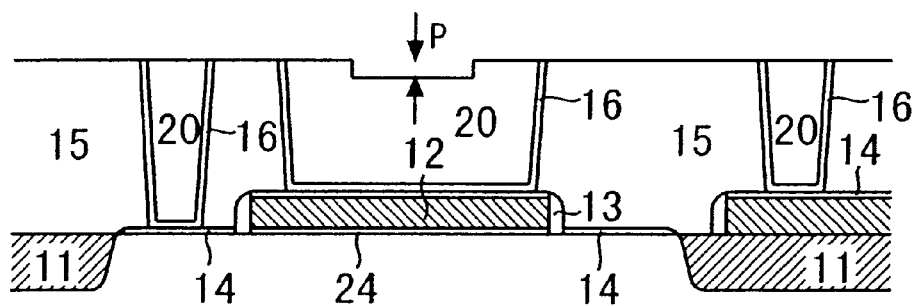
Figure 9E:
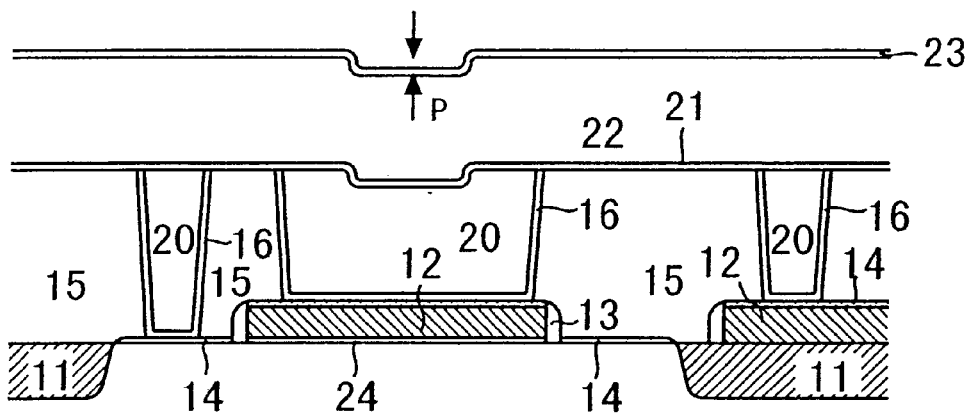

By reference to FIG. 9D, top horizontal portions of the tungsten layer 17 and those of the barrier metal layer 16 are abraded by means of the W-CMP technique, thus forming a tungsten plug 20. At this time, a step P can be formed in the contact alignment mark 19.

Next, as shown in FIG. 3, an additionally-stacked barrier metal layer 21, an ALCu layer 22, and an ARC layer 23 are formed by means of sputtering. AT this time, the step 'P' still remains in the contact alignment mark 19.

In the embodiment, a gate electrode is not formed below the contact alignment mark 19. Hence, the step 'P' formed in the contact alignment mark 19 becomes deeper by the amount corresponding to the height of the gate electrode, thereby improving the accuracy of alignment.

The method of manufacturing a semiconductor device according to the fifth embodiment can be summarized as follows:

In the present embodiment, the gate electrode 12 is formed on the semiconductor substrate 1, and a predetermined portion of the gate electrode 12 is removed. The interlayer dielectric film 15 is formed on the semiconductor substrate 1 including a remaining portion of the gate electrode 12. The interlayer dielectric film 15 forms an opening for contact alignment purpose in the position on the interlayer dielectric film 15 from which the gate electrode 12 has been removed. The tungsten layer 17 is formed on the interlayer dielectric film 15 such that a depression is formed in the opening. The tungsten layer 17 is abraded, to thereby leave a step for alignment in the opening.

Sixth Embodiment

Figure 4:
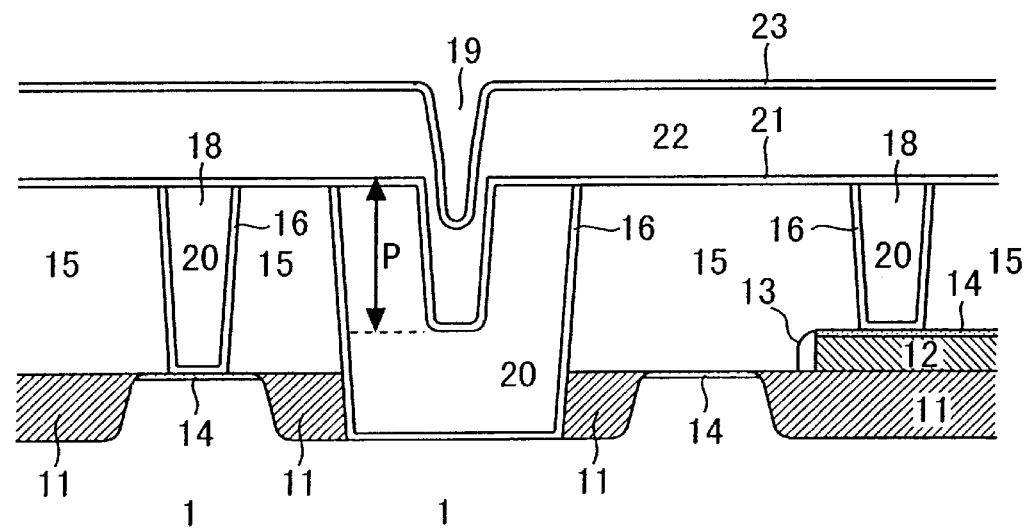
FIG. 4 is a cross-sectional view showing a method of forming an alignment mark in a method of manufacturing a semiconductor device according to a sixth embodiment of the present invention.

FIG. 4 is a cross-sectional view showing a method of manufacturing a semiconductor device according to a sixth embodiment of the present invention; more particularly, to a method of forming an alignment mark.

The present embodiment is intended toward a further improvement in the pattern shown in connection with the fifth embodiment.

In the present embodiment, in order to make deeper the contact alignment mark shown in connection with conventional example 2, a gate electrode to be formed immediately below the contact alignment mark section is removed, and an isolation dielectric film (STI) is provided below the contact alignment mark section, thereby making the alignment mark hole deep so as to enter the isolation dielectric film.

As a result, the step can be expected to be made deeper, by the amount corresponding to the depth of a step formed in the isolation dielectric film (STI), than the step described in connection with the fifth embodiment.

The method of forming a contact alignment mark according to the present embodiment will now be described.

As shown in FIG. 9A, under the conventional method of manufacturing a semiconductor device, the STI 11, the gate oxide film 24, the gate electrode 12, the sidewall 13, and the CoSi layer 14 are formed on the semiconductor substrate 1 (Si) substrate.

In contrast, under the method according to the present embodiment, the STI (e.g., an isolation dielectric film or a buried dielectric film) 11 is formed also at a position at which a contact alignment mark is to be formed (see FIG. 4).

As shown in FIG. 9B, an oxide film is deposited, and the thus-deposited oxide film is smoothed by means of the CMP technique, thereby forming a contact alignment mark 19.

In the present embodiment, the contact alignment mark 19 is formed to a depth such that it extends to the isolation dielectric film 11 or a depth at which it penetrates through the isolation dielectric film 11 to the substrate 1.

Subsequent processes are the same as those required under the conventional method.

More specifically, as shown in FIG. 9C, a barrier metal layer 16 is formed by means of sputtering, and tungsten 17 is deposited by means of the CVD technique.

As shown in FIG. 9D, top horizontal portions of the tungsten layer 17 and those of the barrier metal layer 16 are abraded by means of the W-CMP technique, thereby forming a tungsten plug 20. At this time, a step 'P' can be formed in the contact alignment mark 19.

As shown in FIG. 4, an additionally-stacked barrier metal layer 21, an AlCu layer 22, and an ARC layer 23 are formed by means of sputtering. At this time, the step 'P' still remains, in unmodified form, in the contact alignment mark 19.

In the present embodiment, no gate electrode is present below the contact alignment mark 19. The contact alignment mark 19 penetrates through the buried dielectric film (STI) and extends to the substrate 1. Thus, the step 'P' in the alignment mark 19 is made deeper by the amount corresponding to the sum of the height of the gate electrode and the depth of the buried dielectric film 11, thereby improving the accuracy of alignment.

The method of forming a contact alignment mark according to the present embodiment can be summarized as follows:

In the present embodiment, the buried dielectric layer 11 is formed in a predetermined region on the semiconductor substrate 1. An interlayer dielectric film 15 is formed on the buried dielectric layer 11. An opening used for forming a contact alignment so as to penetrate through the buried dielectric layer 11 is formed in a portion of the interlayer dielectric film 15 corresponding to the predetermined region at which the buried dielectric layer 11 is formed. A tungsten layer 17 is formed on the interlayer dielectric film 15 such that a depression is formed in the opening. The tungsten layer 17 is abraded, thereby forming an alignment step in the opening.

Seventh Embodiment

FIGS. 5A through 7C are cross-sectional views showing a method of manufacturing a semiconductor device according to a seventh embodiment of the present invention; more particularly, to a method of forming a through hole alignment mark.

In the present embodiment, in order to make deeper the step of the alignment mark described in connection with conventional example 3, an underlying Al layer is removed, and a through hole is formed so as to extend to an Al layer disposed two layers below the underlying Al layer or to the Si substrate.

As a result, the alignment mark can be made deeper than that formed in conventional example 3, thereby improving the accuracy of alignment.

The method of forming a contact alignment mark according to the present embodiment will now be described.

Figure 5A:
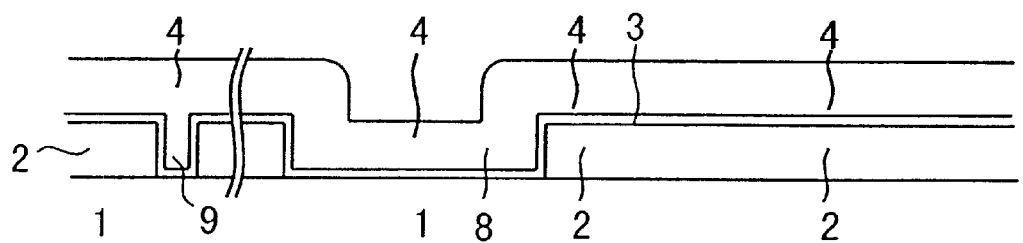
FIGS. 5A through 7C are cross-sectional views showing a method of forming a through hole alignment mark in a method of manufacturing a semiconductor device according to a seventh embodiment of the present invention.
Figure 5B:
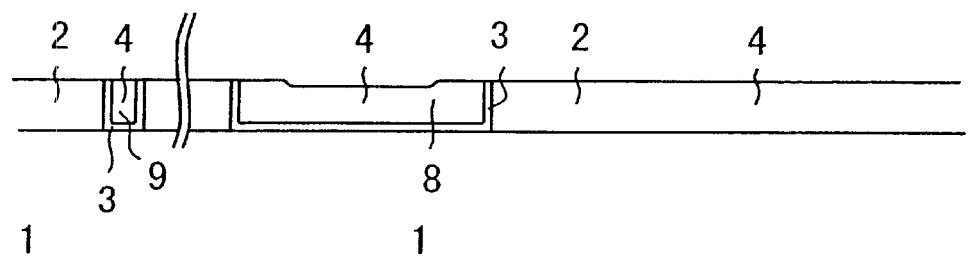
Figure 5C:
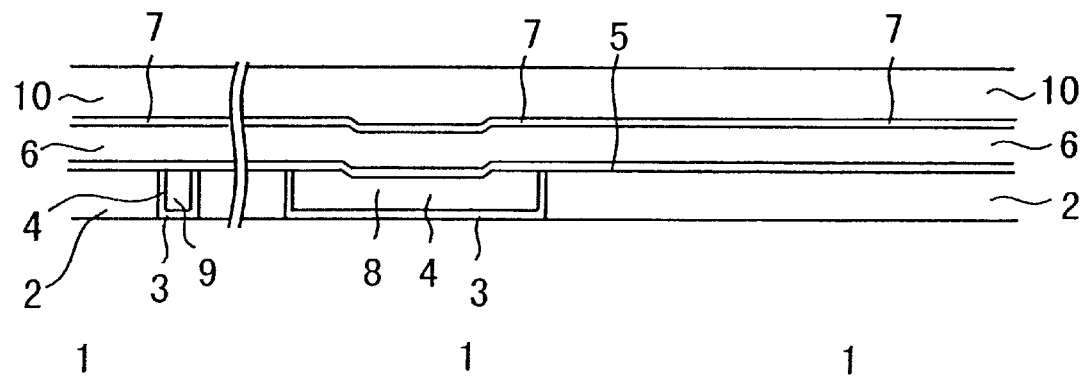
Figure 10A:
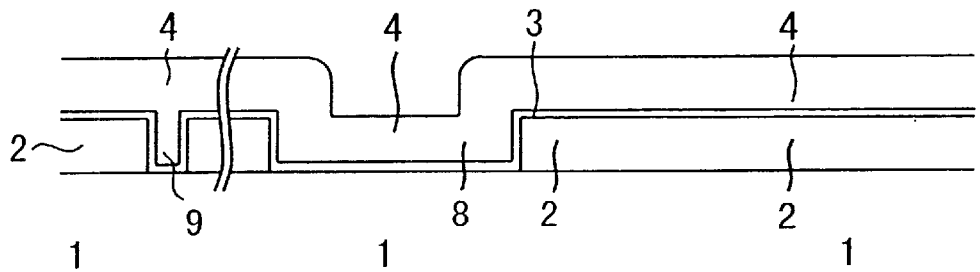
FIGS. 10A through 12C are cross-sectional views showing still another example method of forming an alignment mark carried out during the course of the conventional method of manufacturing a semiconductor device.
Figure 10B:
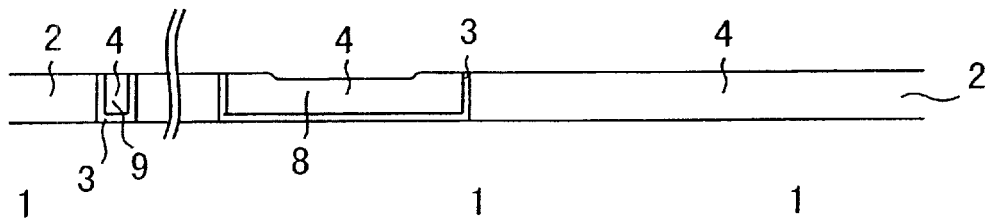
Figure 10C:
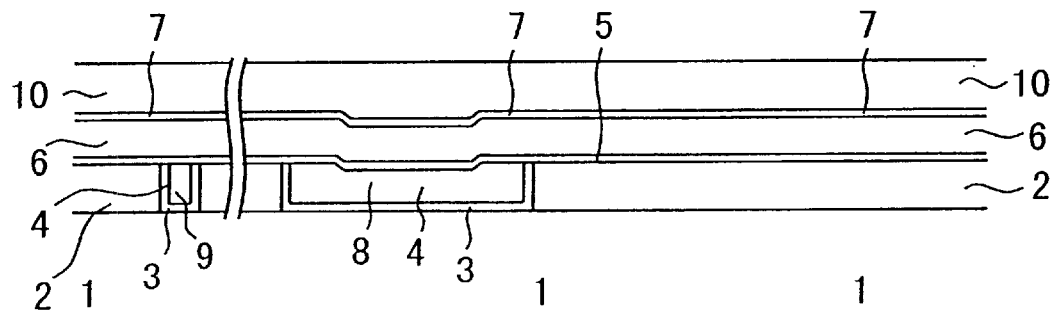

The flow of processes shown in FIGS. 5A through 5C is identical with that shown in FIGS. 10A through 10C in connection with conventional example 3.

Figure 6A:
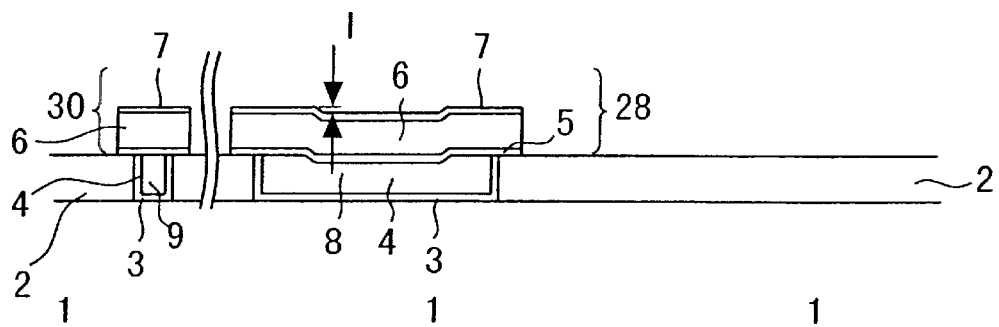

As shown in FIG. 6A, the ARC film 7, the AlCu layer 6, and the additionally-stacked barrier metal layer 5 are selectively etched by means of dry etching. At this time, the Al cap 28 serving as a cap for an alignment mark and the Al interconnection 30 are formed.

Figure 11A:
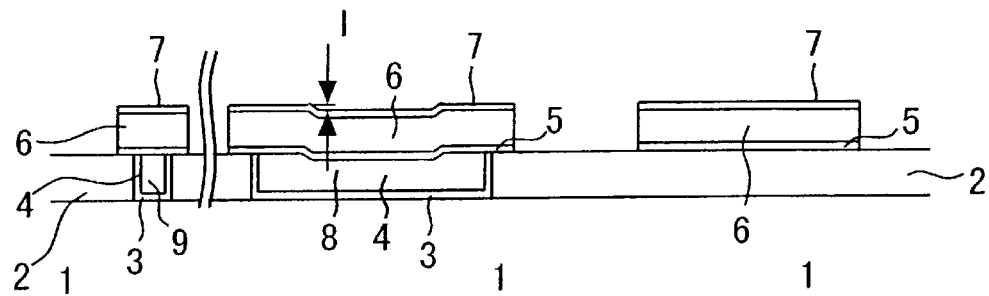
Figure 11B:
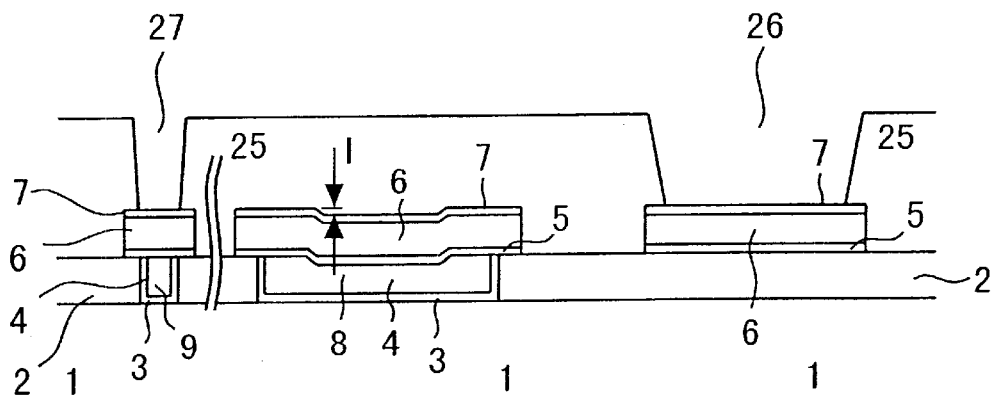
Figure 11C:
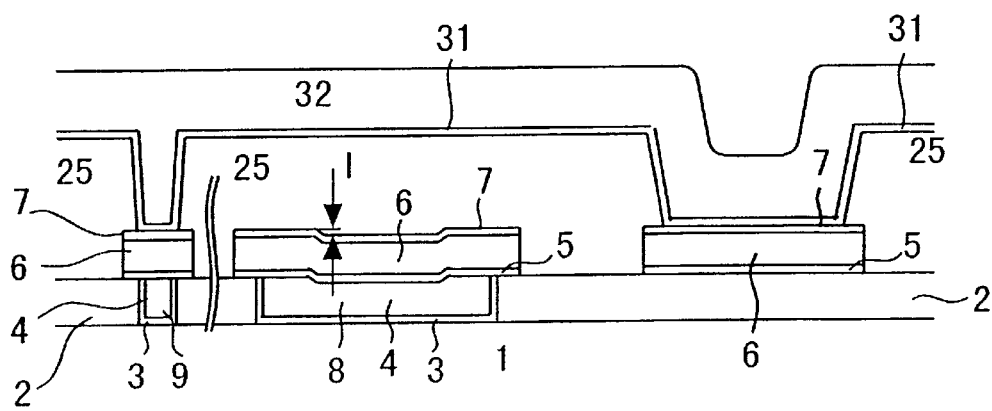
Figure 12A:
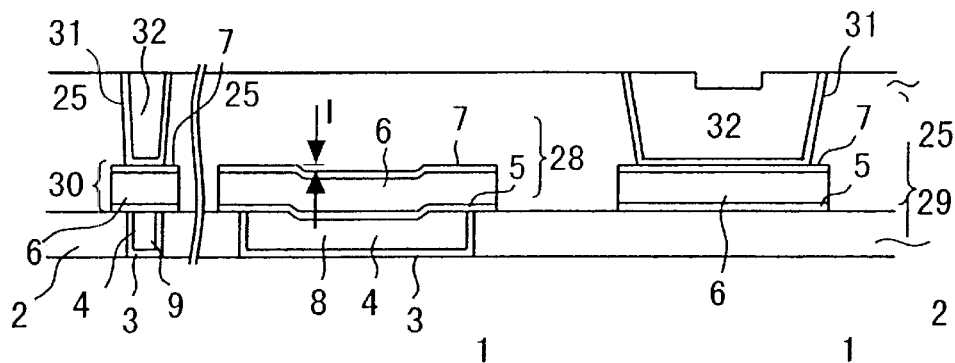
Figure 12B:
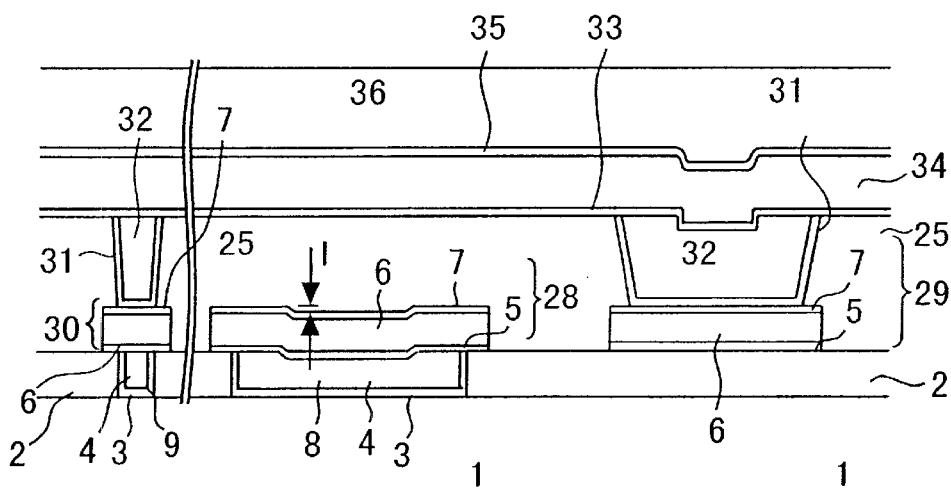
Figure 12C:
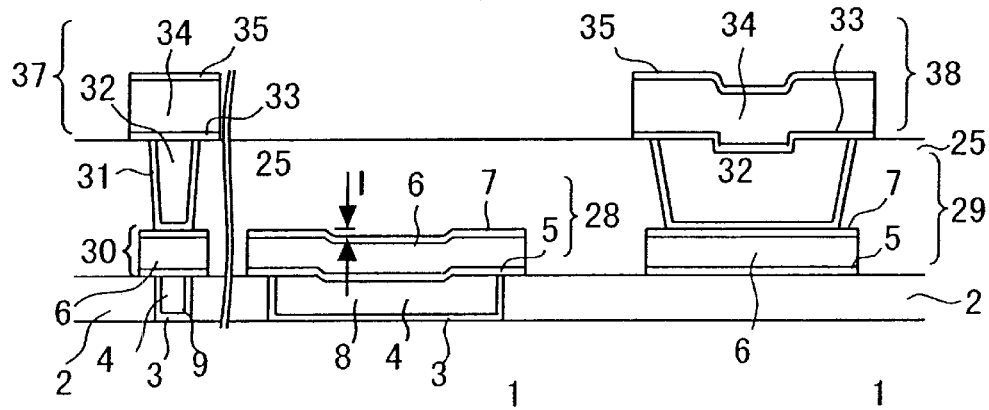
Figure 13A:
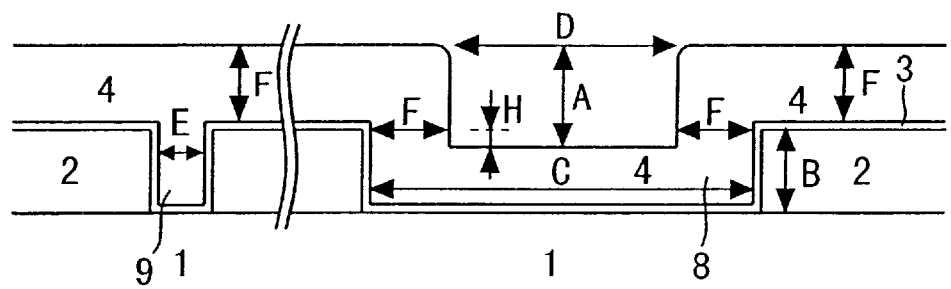
FIGS. 13A to 13C are cross-sectional views showing a process of forming an alignment mark, which are presented to explain a problem to be solved by the present invention.
Figure 13B:
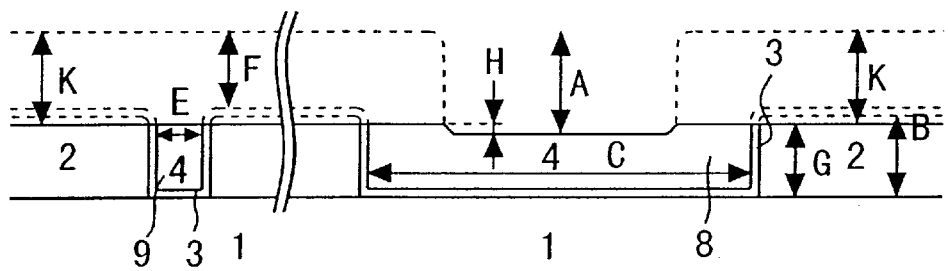
Figure 13C:
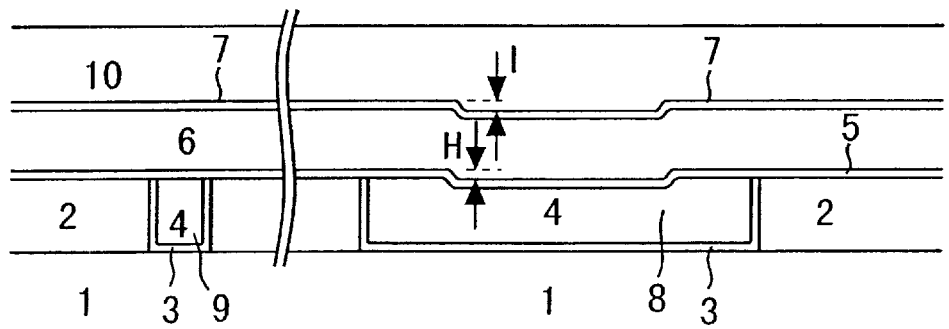

In the process shown in FIG. 11A in connection with conventional example 3, there is formed an underlying Al layer which is to serve as an Al layer underlying a through hole alignment mark. In the present embodiment, the underlying aluminum (Al) layer shown in FIG. 11A is removed from a position at which an alignment mark is to be formed.

Subsequent processes are the same as those required under the conventional method described in connection with conventional example 3.

Figure 6B:
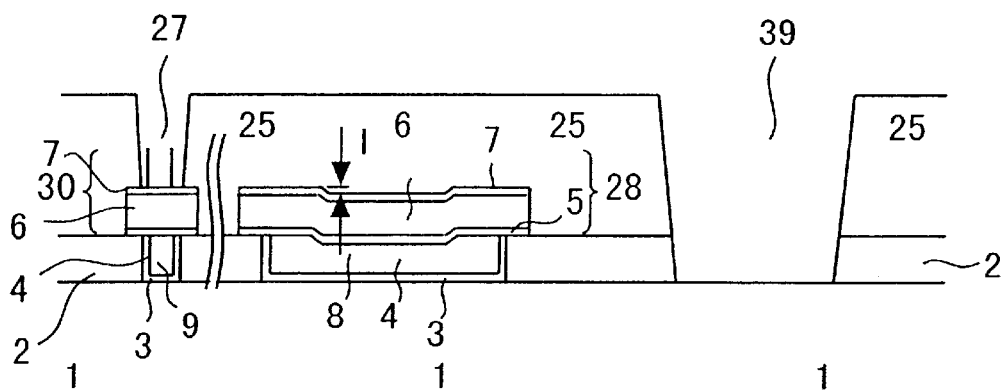

As shown in FIG. 6B, an oxide film is deposited, and the thus-deposited oxide film is smoothed by means of the CMP technique, thereby forming an interlayer oxide film 25.

Next, the corresponding wafer is subjected to photolithography and dry etching, whereby a through hole alignment mark 29 and a through hole 27 are formed.

Figure 6C:
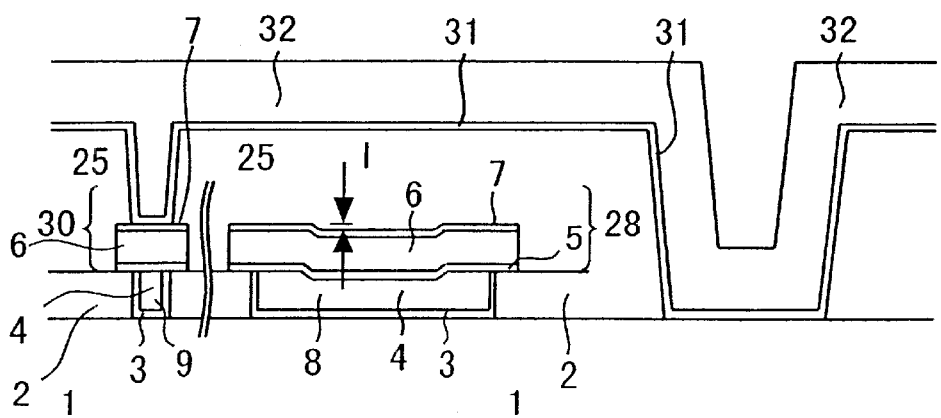

As shown in FIG. 6C, a barrier metal layer 31 is formed by means of sputtering, and tungsten 32 is deposited by means of the CVD technique.

Figure 7A:
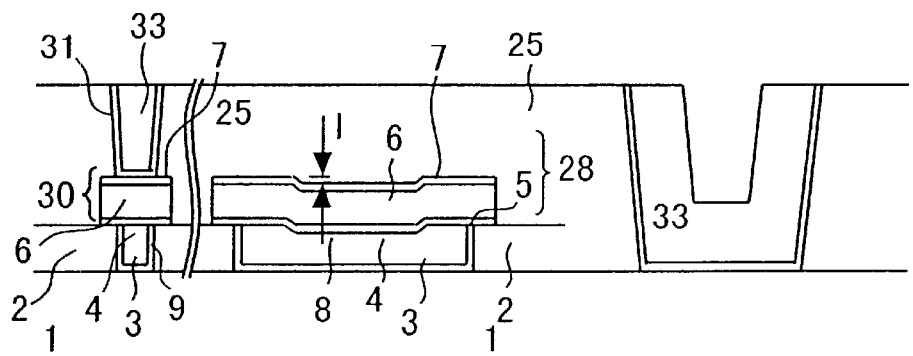

As shown in FIG. 7A, a portion of the tungsten layer 32, a portion of the barrier metal layer 31, and a portion of the interlayer oxide film 25 are abraded by means of the W-CMP technique.

Figure 7B:
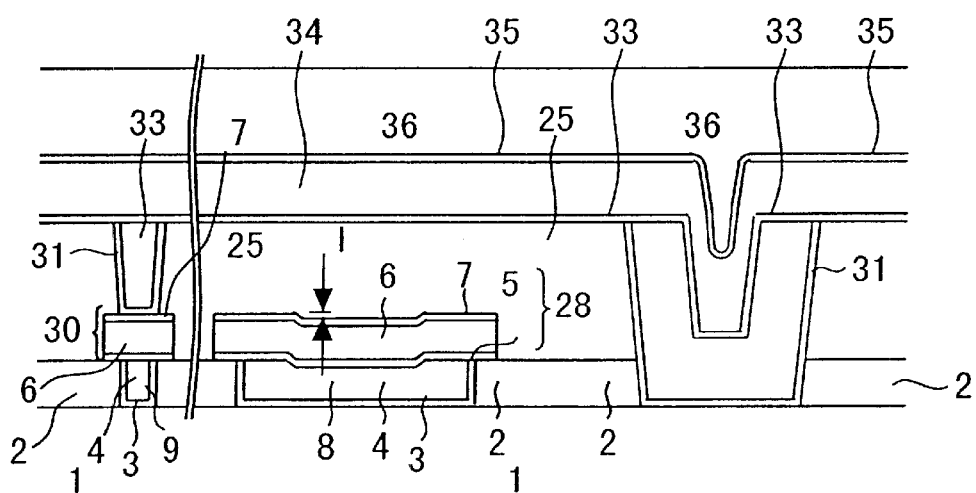

As shown in FIG. 7B, an additionally-stacked barrier metal layer 33, an AlCu layer 34, and an ARC layer 35 are formed by means of sputtering, thereby forming a resist film 36.

Figure 7C:
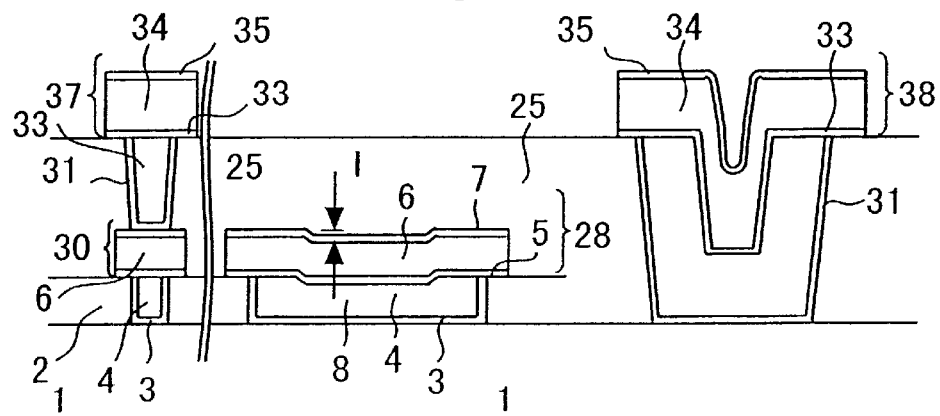
Figure 8A:
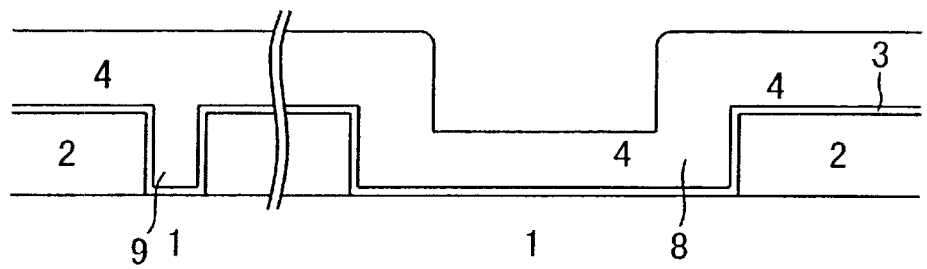
FIGS. 8A to 8C are cross-sectional views showing an example method of forming an alignment mark during the course of the conventional method of manufacturing a semiconductor device.
Figure 8B:
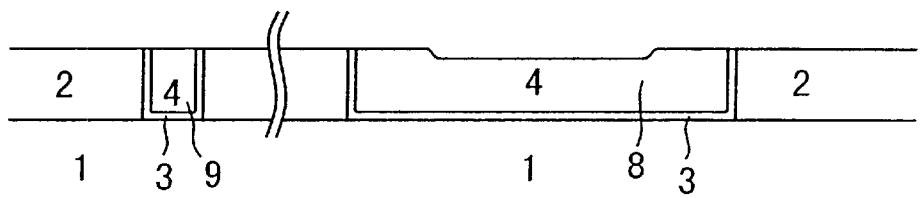
Figure 8C:
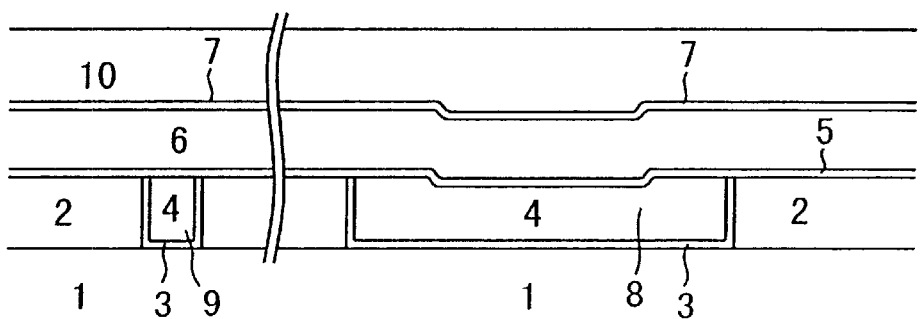

As shown in FIG. 7C, the ARC layer 35, the AlCu layer 34, and the additionally-stacked barrier metal layer 33 are selectively etched, thereby forming an Al electrode 37 and an alignment mark CAP-Al 38.

In the present embodiment, an Al electrode which would be present immediately below the through hole alignment mark is omitted. As a result, the alignment step 'P' is made deeper by the amount corresponding to the height of a conventional underlying Al layer, thereby improving the accuracy of alignment.

The method of forming a contact alignment mark according to the present embodiment can be summarized as follows:

In the present embodiment, an aluminum interconnection 6 is formed on the semiconductor substrate 1. A predetermined portion of the aluminum interconnection 6 is removed, whereby the interlayer oxide film 25 is formed on the semiconductor substrate 1 including the remaining aluminum interconnection 6. An opening for through hole alignment purpose is formed at a position on the interlayer oxide film 25 from which a portion of the aluminum interconnection 6 has been removed. A tungsten layer 32 is formed on the interlayer oxide film 25 such that a depression is formed in the opening. The tungsten layer 32 is abraded, and an alignment step is left in the opening.

In the previous embodiments, reference 1 designates a semiconductor substrate. However, a conductive layer formed on a semiconductor substrate; for example, an aluminum electrode or an aluminum interconnection, may be used as a substitute for the semiconductor substrate.

The effects and advantages of the present invention may be summarized as follows.

According to the present invention, an interlayer dielectric film is formed such that the initial thickness of the interlayer dielectric film becomes greater than the sum total of the minimum step identifiable for alignment and the amount of abrasion. As a result, a step required for an alignment mark can be ensured.

In the present invention, a tungsten layer is etched, and the thus-etched tungsten layer is abraded, thereby forming a step for alignment purpose. As a result, a step for an alignment mark can be ensured even in a thin interlayer dielectric film.

In the present invention, a predetermined portion of a gate electrode is removed, and a contact alignment mark is formed at the position of that portion, thereby forming an alignment step. The contact alignment step is made deeper by the amount corresponding to the height of a gate electrode, thereby improving the accuracy of alignment.

In the present invention, a contact alignment through hole is formed so as to penetrate through a semi-buried dielectric layer, thereby forming an alignment step. As a result, the alignment step is made deeper by the amount corresponding to the total sum of the height of a gate electrode and the depth of a buried dielectric film, thereby improving the accuracy of alignment.

In the present invention, a through hole alignment mark is formed at the position from which an aluminum interconnection has been removed, thereby forming an alignment step. As a result, the alignment step is made deeper by the amount corresponding to the height of an underlying aluminum layer. Thus, the accuracy of alignment is improved.

In the present invention, even when a barrier layer or a conductive layer is formed, an alignment step can be ensured, thereby improving the accuracy of alignment.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-229206, filed on Jul. 28, 2000 including specification, claims, drawings and summary, on which the Convention Priority of the present application is based, are incorporated herein by reference in its entirety.

What is claimed is:

1. A method of manufacturing a semiconductor device, comprising the steps of:

forming an interlayer dielectric film on a semiconductor substrate;

forming an opening for alignment purpose in the interlayer dielectric film;

forming a tungsten layer on the interlayer dielectric film such that a depression is formed in the opening; and abrading the tungsten layer or the tungsten layer and portions of the upper surface of the interlayer dielectric film, to thereby form an alignment step in the opening;

wherein the interlayer dielectric film is formed such that an initial thickness of the interlayer dielectric film is greater than the total sum of the minimum step identifiable for alignment and the amount of abrasion of the tungsten layer and the interlayer dielectric film.

2. The method of manufacturing a semiconductor device according to claim 1, wherein the step of forming the alignment step is followed by a step of forming a metal barrier layer on the alignment step.

3. The method of manufacturing a semiconductor device according to claim 2, wherein the step of forming the metal barrier layer is followed by a step of forming a conductive layer on the metal barrier layer.

4. The method of manufacturing a semiconductor device according to claim 3, wherein the step of forming the conductive layer is followed by a step of forming another metal barrier layer on the conductive layer.

5. A method of manufacturing a semiconductor device, comprising the sequential steps of:

forming an interlayer dielectric film on a semiconductor substrate;

form an opening for alignment purpose in the interlayer dielectric film;

forming a tungsten layer on the interlayer dielectric film such that a depression is formed in the opening;

etching the tungsten layer so that the thickness is reduced by a predetermined amount; and abrading the tungsten layer, to thereby form an alignment step in the opening.

6. The method of manufacturing a semiconductor device according to claim 5, wherein the tungsten layer is etched isotropically.

7. The method of manufacturing a semiconductor device according to claim 6, wherein the tungsten layer is etched isotropically through use of hydrated ammonium.

8. A method of manufacturing a semiconductor device, comprising the steps of:

forming a gate electrode on a semiconductor substrate;

removing a predetermined portion from the gate electrode;

forming an interlayer dielectric film on the semiconductor substrate including the gate electrode;

forming an opening for contact alignment purpose at a position on the interlayer dielectric film from which the gate electrode has been removed;

forming a tungsten layer on the interlayer dielectric film such that a depression is formed in the opening; and abrading the tungsten layer, to thereby form an alignment step.

* * * * *